United States Patent
Figueiredo

(10) Patent No.: US 8,471,755 B1
(45) Date of Patent: Jun. 25, 2013

(54) DYNAMIC BIASING IN SWITCHED CAPACITOR STAGES USING FRAME CAPACITORS

(75) Inventor: Pedro M. Figueiredo, São Domingos de Rana (PT)

(73) Assignee: Synopsys, inc., Mountain View, CA (US)

( * ) Notice: Subject to any disclaimer, the term of this patent is extended or adjusted under 35 U.S.C. 154(b) by 0 days.

(21) Appl. No.: 13/357,346

(22) Filed: Jan. 24, 2012

(51) Int. Cl.
*H03M 1/12* (2006.01)

(52) U.S. Cl.
USPC .......................... 341/172; 341/155; 341/163

(58) Field of Classification Search
USPC .................................................. 341/163, 172
See application file for complete search history.

(56) References Cited

U.S. PATENT DOCUMENTS

| | | | | |
|---|---|---|---|---|
| 6,667,707 | B2* | 12/2003 | Mueck et al. | 341/172 |
| 7,167,121 | B2* | 1/2007 | Carreau et al. | 341/150 |
| 7,432,844 | B2* | 10/2008 | Mueck et al. | 341/163 |
| 7,961,132 | B1* | 6/2011 | Perry et al. | 341/172 |
| 8,378,864 | B2* | 2/2013 | Zhao et al. | 341/118 |

OTHER PUBLICATIONS

Abo, A. et al., "A 1.5-V, 10-bit, 14.3-MS/s CMOS Pipeline Analog-to-Digital Converter," IEEE Journal of Solid-State Circuits, May 1999, pp. 599-606, vol. 34, No. 5.
Cao, Z. et al., "A 32 mW 1.25 GS/s 6b 2b/Step SAR ADC in 0.13 μm CMOS," IEEE Journal of Solid-State Circuits, Mar. 2009, pp. 862-873, vol. 44, No. 3.
Choi, H-C. et al., "A 15mW 0.2mm$^2$ 10b 50MS/s ADC with Wide Input Range," 2006 IEEE International Solid-State Circuits Conference, IEEE, Feb. 7, 2006, 10 pages.
Crols, J. et al., "Switched-Opamp: An Approach to Realize Full CMOS Switched-Capacitor Circuits at Very Low Power Supply Voltages," IEEE Journal of Solid-State Circuits, Aug. 1994, pp. 936-942, vol. 29, No. 8.
Galan, J.A. et al., "Super Class-AB OTAs With Adaptive Biasing and Dynamic Output Current Scaling," IEEE Transactions on Circuits and Systems—I. Regular Papers, Mar. 2007, pp. 449-457, vol. 54.
Kim, H-C. et al., "A 30mW 8b 200MS/s Pipelined CMOS ADC Using a Switched-Opamp Technique," 2005 IEEE International Solid-State Circuits Conference, Feb. 8, 2005, pp. 284-285, 598.

* cited by examiner

*Primary Examiner* — Khai M Nguyen
(74) *Attorney, Agent, or Firm* — Fenwick & West LLP

(57) ABSTRACT

A system and a method are disclosed for establishing the biasing point of a comparator in a successive approximation analog-to-digital converter (SAR ADC) by transferring an electric charge from a series of capacitors in a switched-capacitor array into a frame capacitor. The frame capacitor is formed by a parasitic capacitance between the series of capacitors and a conductive metal frame that surrounds the capacitors. To induce the charge transfer, the conductive metal frame is connected to a clock signal, which alternately drives the frame between a supply voltage and ground. By using the frame capacitor instead of a separate power source to establish the biasing point, the current consumption of the SAR ADC is reduced.

20 Claims, 7 Drawing Sheets

DYNAMIC BIASING IN SWITCHED CAPACITOR STAGES USING FRAME CAPACITORS

BACKGROUND

1. Field of Art

The disclosure generally relates to the field of analog-to-digital converters (ADCs), and more specifically to establishing a bias voltage for a comparator or an amplifier within an ADC.

2. Description of the Related Art

An analog-to-digital converter (ADC) is an electronic device that converts a continuous analog quantity, such as a voltage or current, into a series of discrete digital values. ADCs are a fundamental building block of video, radar, communication, and instrumentation systems and are part of most consumer electronics equipment. ADCs may be implemented using several different architectures, and each implementation comes with different advantages and disadvantages.

One type of ADC is the successive approximation ADC (SAR ADC), which has a relatively simple architecture with low power consumption. SAR ADCs are typically used in situations where a low or medium sampling rate and low power consumption is desired.

SUMMARY

Embodiments relate to using a frame capacitor in lieu of a separate power source to establish the biasing point of an electronic component within an electronic device. The frame capacitor includes a capacitance that forms between a series of capacitors in the electronic device and a conductive metal frame that at least partially surrounds at least some of the series of capacitors. The electronic device operates switches and changes the voltage of the frame to transfer an electric charge from the series of capacitors into the frame capacitor. The charge transfer causes a change in the voltage at an input terminal of the electronic component, and the change in voltage establishes the component's biasing point.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Overview of Successive Approximation Analog-to-Digital Converter

Figure 1:
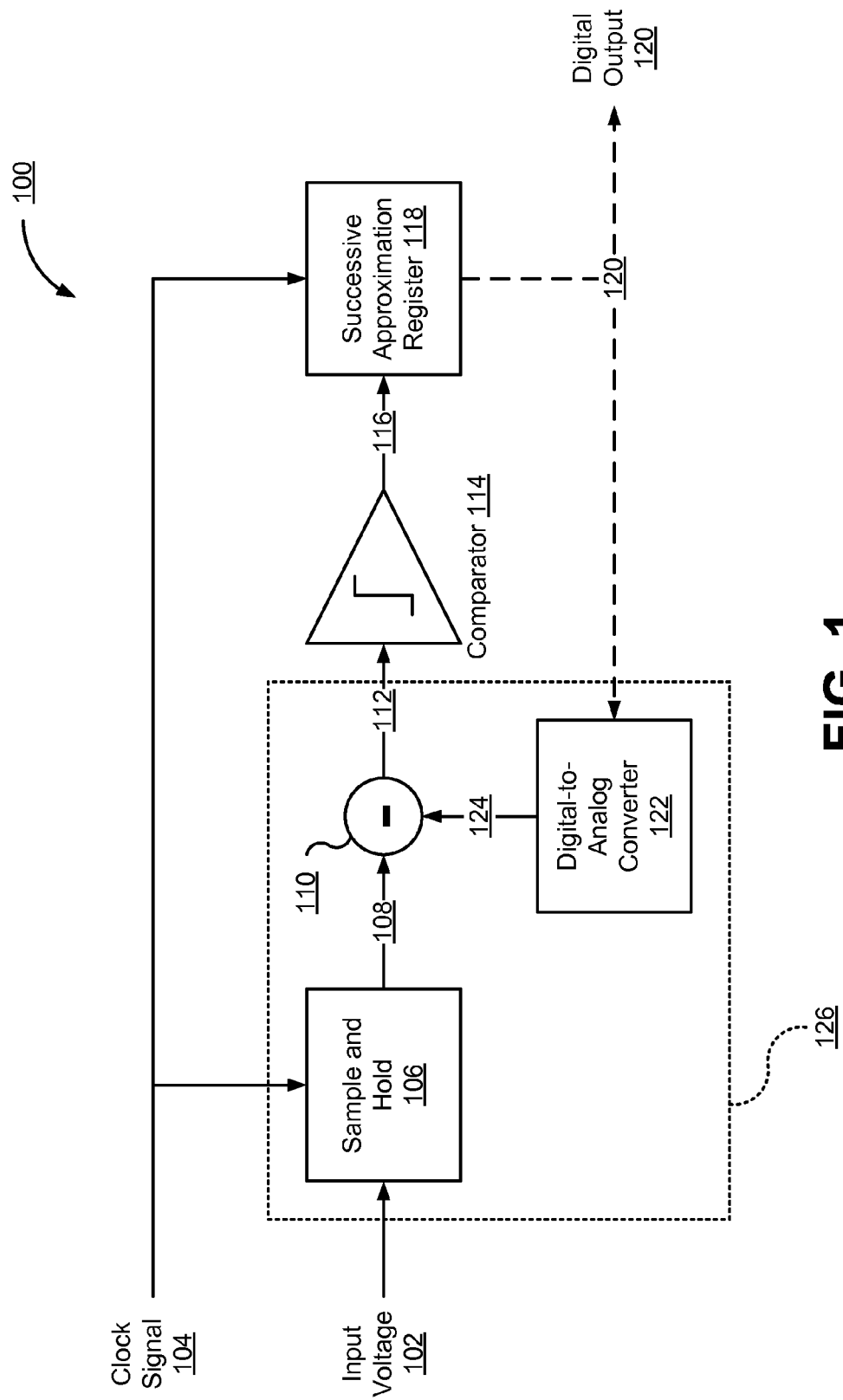
FIG. 1 is a high-level block diagram of a successive approximation ADC.

FIG. 1 is a high-level block diagram of a successive approximation ADC (SAR ADC) 100. The SAR ADC 100 contains a sample and hold circuit 106, a subtractor 110, a comparator 114, a successive approximation register 118, and a digital-to-analog converter (DAC) 122. The functions of the sample and hold circuit 106, the subtractor 110, and the DAC 122 may be implemented together as a switched-capacitor circuit 126, and detailed explanations of the switched-capacitor circuit 126 are provided below with reference to FIG. 2 and FIG. 3. The SAR ADC 100 may also contain additional components or inputs, such as a built-in oscillator to generate the clock signal 104 or power sources for providing power and reference voltages, which are omitted from FIG. 1 for the sake of clarity. The SAR ADC 100 receives an analog input voltage 102 and a clock signal 104. During each conversion cycle, the SAR ADC 100 samples the analog input voltage 102 and outputs a digital value 120 representing the value of the analog input voltage 102 relative to a reference voltage. For example, if the reference voltage is 10 V, the input voltage 102 is 7 V, and the ADC has a resolution of four bits, then the digital output 120 would be binary 1011, which signifies that the analog input 102 was approximately 68.75% of reference voltage.

At the beginning of a conversion cycle, the sample and hold circuit 106 samples the input voltage 102 and outputs the value of the sampled voltage to the subtractor 110. The subtractor 110 is also connected to a DAC 122, which converts the digital output 120 of the successive approximation register 118 back into an analog voltage 124. The comparator 114, successive approximation register 118, and DAC 122 operate in conjunction to perform a binary search process that iteratively determines a value for each bit of the digital output 120.

To begin the binary search process, the output 120 of the successive approximation register 118 is set to an initial value whose most significant bit is binary 1 and every other bit is binary 0. For example, the initial value for a four-bit SAR ADC 100 is binary 1000. In the first iteration, the most significant bit is designated as the "current digit." This initial digital output 120 is sent to the DAC 122, which generates an analog voltage 124 that is exactly half of the reference voltage. For example, if the reference voltage is 10 V (which defines a voltage range that spans from 0 V to 10 V), then the DAC output 124 would be 5 V. The subtractor 110 outputs the difference 112 between the sampled input signal 108 and the output 124 of the DAC.

The comparator 114 receives the difference 112 calculated by the subtractor 110 and outputs a binary signal 116 to the successive approximation register 118 indicating the proper value of the current digit. In the first iteration, if the sampled input 108 is between 0 V and 5 V, then the difference 112 would indicate that the sampled input 108 was less than the DAC output 124. As a result, the comparator 114 generates an output 116 of binary 0 and the successive approximation register 118 decreases the value of the current digit to binary 0. Similarly, the successive approximation register 118 would keep the value of the current digit at binary 1 if the sampled input is between 5 V and 10 V. Continuing with the example where the input voltage was 7 V, the successive approximation register 118 would keep the value of the current digit at binary 1. In the next iteration, the second-most significant bit is designated as the current bit, and the process repeats to determine whether the sampled voltage is between 5 V and 7.5 V or between 7.5 V and 10 V. This binary search process continues until the successive approximation register 118 iterates through each bit of the digital output 120 and determines a value for each digit. After each iteration, the DAC output 124 gets closer to the sampled input 108 and the difference 112 gets smaller.

It is advantageous for the comparator 114 to operate reliably during the binary search process. An effective way of improving the performance of the comparator 114 is to establish a biasing voltage value for the difference input 112 so that field-effect transistors (MOSFETs) in the comparator 114 are properly biased. Establishing a proper biasing voltage for the comparator 114 allows the comparator 114 to operate more effectively. For example, instead of generating an output signal 112 between −5 V and +5 V (i.e., performing a pure subtraction operation between the sampled input 108 and the DAC output 124), the subtractor output 112 may be biased to half of the reference voltage. For example, the output signal 112 could be biased to +5 V, which would yield an output range of between 0 V and 10 V. A biasing point may also be chosen so that the comparator 114 has the same rails as other components of the SAR ADC 100, which removes the need to provide the comparator 114 with separate supply voltages.

Example Switched—Capacitor Circuit

Figure 2:
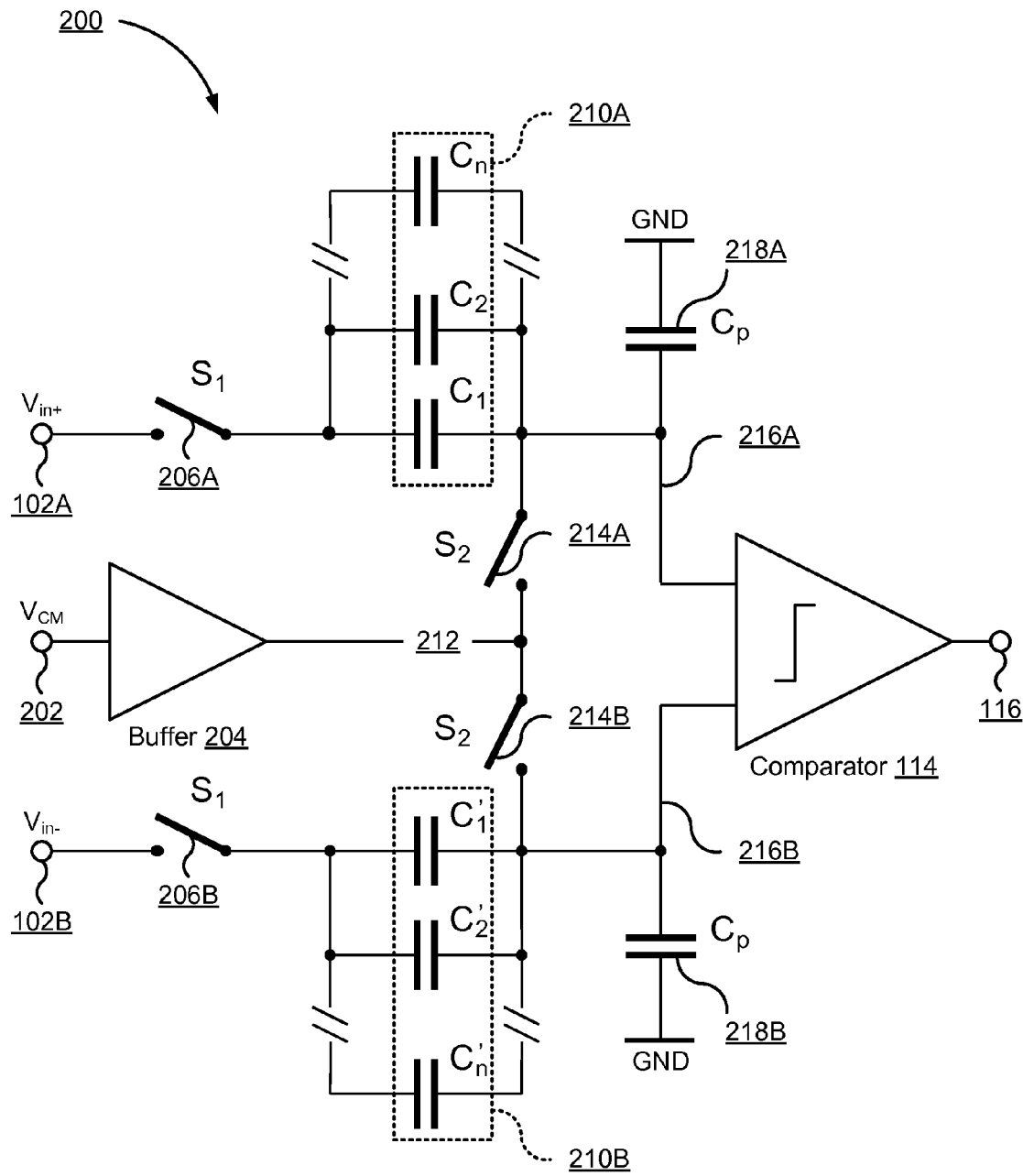
FIG. 2 is a circuit diagram illustrating a switched-capacitor circuit for performing the sample and hold, subtraction, and digital-to-analog conversion functions of the SAR ADC.

FIG. 2 is a circuit diagram illustrating an example switched-capacitor circuit 200 that performs the functions of the sample and hold circuit 106, the subtractor 110, and the DAC 112 of the SAR ADC 100. The switched-capacitor circuit 200 contains a buffer 204 that is used to establish the biasing point at the nodes 216A and 216B, which are connected to the inputs of the comparator 114. Although the analog input 102 is represented as a differential signal 102A, 102B, the circuit 200 may be modified to receive the analog input 102 as single-ended signal, for example by removing the components 206B, 210B in the bottom half and maintaining the second common node 216B (i.e., the second comparator input) at the biasing point.

At the beginning of a conversion cycle, the first set of switches $S_1$ 206A and 206B, and the second set of switches $S_2$ 214A and 214B are turned on. As a result, the left plates of the capacitors in the capacitor arrays 210A, 210B are connected to the analog inputs 102A, 102B, and the right plates are brought to the biasing point of $V_{CM}$ by the buffer 204. In each capacitor array 210A, 210B, the difference between input voltage $V_{in+}$ 102A or $V_{in-}$ 102B and the biasing voltage $V_{CM}$ 202 causes a charge to build up in the capacitor arrays 210A, 210B. The amount of charge that builds up in the capacitor arrays 210A, 210B is effectively a sample of the analog input voltages 102A, 102B relative to the biasing point. After the capacitor arrays 210A, 210B are charged, both sets of switches 206, 214 are turned off, which allows both plates of the capacitors in the capacitor arrays 210A, 210B to float.

Although not shown in FIG. 2, the left plate of each capacitor in the switched-capacitor arrays 210A, 210B is also connected to two additional switches. The first switch connects the left plate to a supply voltage $V_{DD}$, and the second switch connects the left plate to ground. When the left plate of a capacitor is switched to the supply voltage $V_{DD}$, a positive charge is injected into the node 216A or 216B, thus increasing the voltage at the node 216A or 216B. Similarly, when the left plate of a capacitor is switched to ground, a negative charge is injected into the node 216A, 216B, thus decreasing the voltage at the node 216A, 216B. Each switched-capacitor array 210A, 210B also receives the digital output 120 from the successive approximation register 118, and each bit of the digital output 120 is used to control the switches for a different capacitor during a binary search process. Furthermore, the capacitors in each capacitor array 210A, 210B have binary weights. For example, $C_2$ has twice the capacitance of $C_1$, and $C_3$ has twice the capacitance of $C_2$. Together, the switches to $V_{DD}$ and ground and the binary-weighted capacitance values allow each switched-capacitor array 210A, 210B to receive the digital output 120 and add or subtract a corresponding analog voltage from the nodes 216A, 216B. In other words, the switched-capacitor arrays 210A, 210B can be used to perform the functions of the DAC 122 and the subtractor 110.

The switched-capacitor circuit 200 shown in FIG. 2 comes with two significant drawbacks that reduce the circuit's effectiveness. First, there are parasitic capacitances 218A, 218B that increase noise during the sampling phase and introduce attenuation, thereby increasing the input-referred noise voltage value of the comparator. The main contributor to the parasitic capacitances 218A, 218B is the space between the capacitors in the capacitor arrays 210A, 210B and a conductive metal frame that surrounds the capacitors. This space forms a frame capacitor. If the capacitor arrays 210A, 210B are implemented as a collection of unit capacitors that are connected in parallel to form the binary-weighted capacitance values, then the frame capacitor can have a value that is comparable in magnitude to the total capacitance of the capacitor arrays 210A, 210B. Other contributors to the capacitance are the input capacitance of the comparator 114 and the capacitance due to the routing lines used to transmit signals between different components of the circuit.

The second drawback is that the buffer 204 used to establish the biasing point at the common nodes 216A, 216B draws a significant amount of current, and the power consumption of the buffer does not decrease in proportion to the sample rate. At lower sample rates, the current consumption associated with tasks such as charging the capacitor arrays 210A, 210B, operating the switches 206, 214, and performing the binary search is lower because the conversion cycles are longer. However, it is difficult to design a buffer 204 to reliably generate such small currents, so the buffer 204 is set to generate a current corresponding to the maximum sampling rate of the SAR ADC 100 regardless of the sampling rate that is actually used. As a result, the buffer 204 draws a disproportionately larger amount of current relative to the rest of the SAR ADC 100 when operating at lower sampling rates.

The comparator 114 has a non-inverted input connected to the node 216B and an inverted input connected to the node 216A. The output of the comparator 114 (i.e., the binary signal 116) turns high when the voltage difference between non-inverted input and the inverted input is larger than zero. If the voltage difference between the two comparator inputs remains below zero, then the output of the comparator 114 is low.

Bestablishing Biasing Point of Comparator by Frame Capacitors

Figure 3:
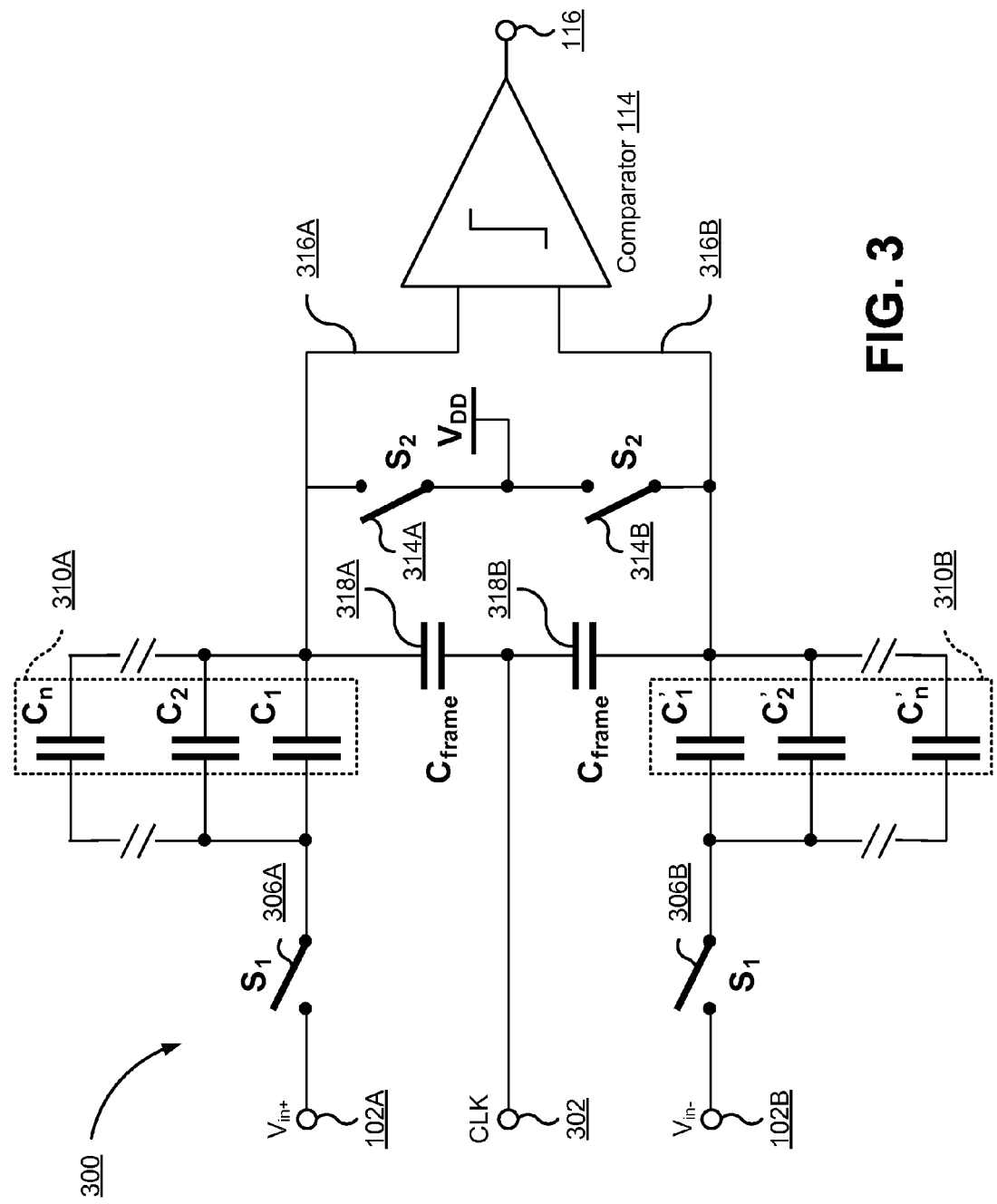
FIG. 3 is a circuit diagram illustrating a switched-capacitor circuit that uses frame capacitors to establish the biasing point of the comparator, according to one embodiment.

Embodiments relate to using frame capacitors instead of a dedicated power source (e.g., the buffer 204 of the previous circuit 200) to establish the biasing point of the comparator 114. FIG. 3 is a circuit diagram illustrating a switched-capacitor circuit 300 that uses frame capacitors 318 to establish the biasing point of the comparator 114, according to one embodiment. The switched-capacitor circuit 300 of FIG. 3 contains switched-capacitor arrays 310A, 310B, a first set of switches $S_1$ 306A, 306B, a second set of switches $S_2$ 314A, 314B, and frame capacitors 318A, 318B. Similar to the circuit shown in FIG. 2, the switched-capacitor circuit 300 of FIG. 3 contains common nodes 316A, 316B that connect the input terminals of the comparator 114 to the right plates of the capacitors $C_1$ through $C_n$ in the capacitor arrays 310A, 310B.

The switches 306A, 306B, 314A, 314B are electronic components that alternate between low impedance and high impedance depending on the value of a binary control signal. The switches 306A, 306B, 314A, 314B in the circuit may be embodied as one or more MOSFET transistors.

Both of the switched-capacitor arrays 310A and 310B contain a collection of parallel capacitors $C_1$ through $C_n$ and $C_1'$ through $C_n'$ with binary-weighted capacitance values. The capacitance values of corresponding capacitors within the two switched-capacitor arrays are nominally equal. For example, $C_1$ has the same value as $C_1'$, and $C_2$ has the same value as $C_2'$. As used herein, array capacitors refer to the capacitors $C_1$ through $C_n$ and $C_1'$ through $C_n'$ in the switched-capacitor arrays 310A and 310B. As described below in detail with reference to FIG. 4, the left plate of each array capacitor is connected via switches 404A through 404N to the supply voltage $V_{DD}$ and via switches 405A through 405N to ground. The switched-capacitor arrays 310A, 310B receive the digital output 120 and can operate the series of switches to decrease the voltage at the nodes 316A, 316B by an amount corresponding to the digital output 120. Thus, the switched-capacitor arrays 310A, 310B sample the input signal and implement the functions of the DAC 122 and the subtractor 110.

The frame capacitors 318A, 318B represent capacitors formed between the array capacitors and a conductive metal frame that surrounds the array capacitors. Conventionally, the conductive metal frame is connected to a fixed potential (e.g., ground) and functions as shielding to prevent stray capacitances from forming between individual array capacitors. However, the conductive metal frame also results in a capacitance between the frame and each array capacitor, thus creating a frame capacitor. Embodiments instead connect the conductive metal frame of the circuit 300 shown in FIG. 3 to the clock signal 302, thereby using the frame capacitors 318A, 318B to modify the node voltages 316A and 316B, as described below in detail with reference to FIG. 5A and FIG. 5B.

During a sampling phase at the beginning of each conversion cycle, the second set of switches $S_2$ 314A, 314B is turned on, which brings the nodes 316A, 316B to the supply voltage $V_{DD}$. Since the clock signal 302 is switched to high at the beginning of the conversion cycle and the conductive metal frame is connected to the clock signal 302, the frame is also at the supply voltage $V_{DD}$ at this time. As a result, there is no voltage difference over the frame capacitors 318A, 318B, so any charge that built up in the frame capacitors 318A, 318B during the previous sampling cycle is discharged.

The first set of switches $S_1$ 306A, 306B is also turned on during the sampling phase, which connects the left plates of array capacitors to the analog inputs 102A, 102B. This results in a voltage difference over the capacitors in the capacitor arrays 310A, 310B, which causes a charge to build up in the array capacitors. The built-up charge in the array capacitors represents a sample of the analog inputs 102A, 102B relative to the supply voltage $V_{DD}$.

The array capacitors sample the analog inputs 102A, 102B during the sampling phase by building up a corresponding charge. At the end of the sampling phase, both sets of switches 306A, 306B, 314A, 314B are turned off, which allows the nodes 316A, 316B to float. In one embodiment, the second set of switches $S_2$ 314A, 314B is turned off a short time before the first set of switches $S_1$ 306A, 306B to prevent any signal dependent charge injection error from switches $S_1$ 306A, 306B.

Figure 4:
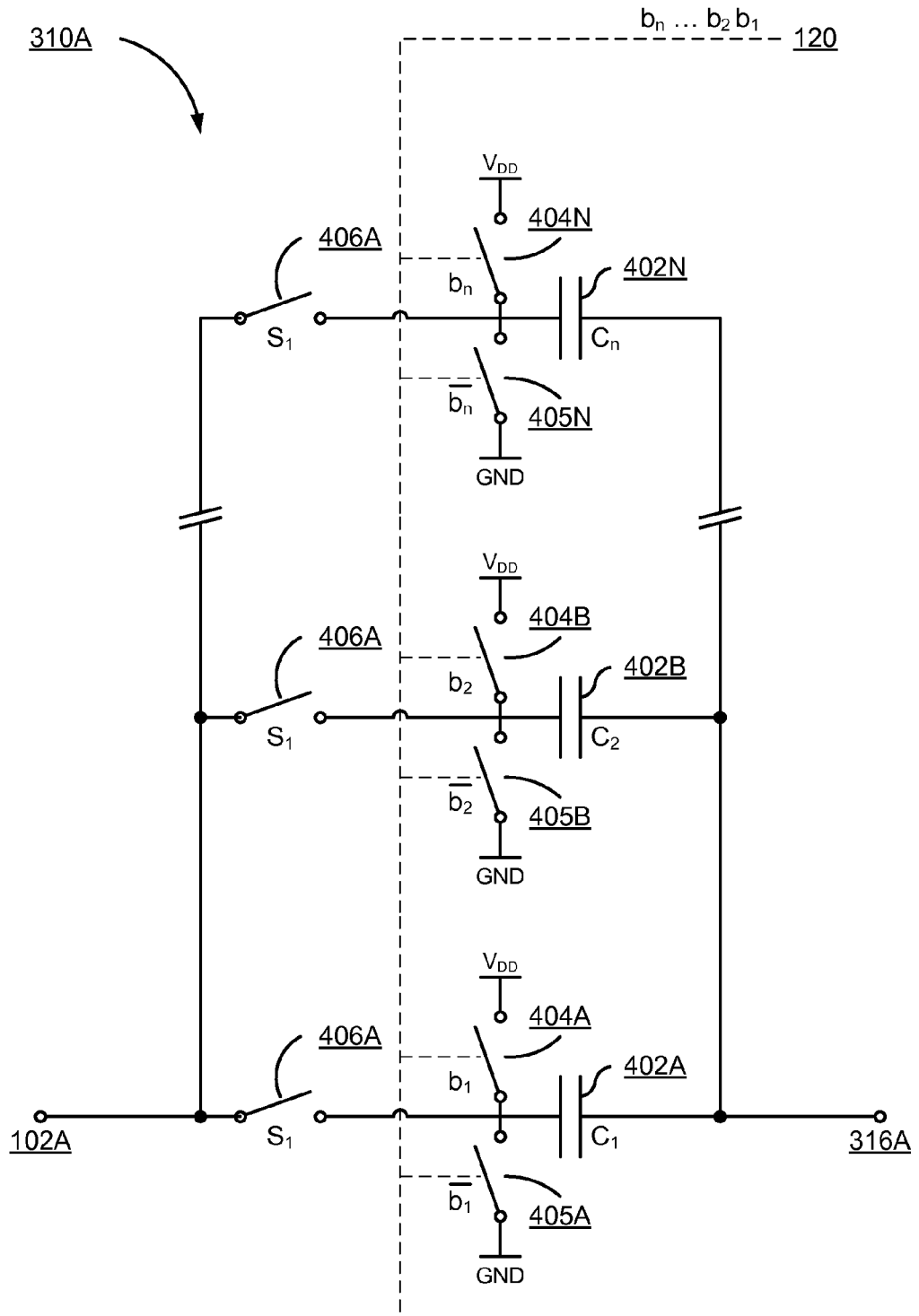
FIG. 4 is a circuit diagram illustrating a detailed view of a switched-capacitor array in a switched-capacitor circuit, according to one embodiment.

Additionally, the first set of switches $S_1$ is shown in FIG. 3 as only two switches 306A, 306B for the sake of brevity. In reality, the first set of switches is embodied as a separate switch connected to the left plate of the capacitor in each branch of the switched-capacitor arrays 310A, 310B. In addition to disconnecting each array capacitor from the analog inputs 102A, 102B, arranging the first set of switches 306A, 306B in this manner would also disconnect the left plates of the array capacitors from each other when the first set of switches is turned off. An implementation with the first set of switches 306A, 306B arranged in this manner is shown in FIG. 4.

Since both sets of switches 306A, 306B, 314A, 314B are turned on at the beginning of the sampling phase (i.e., when the clock signal and the frame are at the supply voltage $V_{DD}$) and turned off at the end of the sampling phase (i.e., when the clock signal and the frame are at ground), both sets of switches 306A, 306B, 314A, 314B may be operated by connecting their respective control signals to the clock signal 302 or the conductive metal frame. In the embodiment where the second set of switches 314A, 314B is turned off slightly before the first set of switches 306A, 306B to prevent charge injection error, a delay circuit, as known in the art, may be used to delay the control signal for the first set of switches 306A, 306B.

In addition to turning off both sets of switches 306A, 306B, 314A, 314B, the clock signal 302 is also changed from high to low at the end of the sampling phase. This change in the clock signal causes the voltage of the frame to drop to ground. As a result of turning off the switches 306A, 306B, 314A, 314B and grounding the conductive metal frame, one plate of the frame capacitors 318A, 318B is grounded and the other plate is floating, and both plates of the array capacitors are also floating.

Since the floating plates of the frame capacitors 318A, 318B are also connected to the right plates of the array capacitors, the drop in the frame voltage causes a positive charge to be transferred from the array capacitors into frame capacitors 318A, 318B. This charge redistribution reduces the voltage at the nodes 316A, 316B from $V_{DD}$ to $C_{array}/(C_{array}+C_{frame})*V_{DD}$, where $C_{array}$ is the total capacitance of the array capacitors in one of the switched-capacitor arrays 310A or 310B and $C_{frame}$ is the value of one frame capacitor 318A or 318B. That is, the voltage at the common nodes 316A, 316B is the result of a capacitive voltage divider between the array capacitors and the frame capacitors.

In reality, the input capacitance of the comparator 114 and parasitic capacitance due the routing lines from the array capacitors to the comparator inputs also absorb some of the positive charge that is redistributed, and these capacitances will also have an effect on the node voltages 316A, 316B. However, the value of the frame capacitors 318A, 318B is typically much higher than these other stray capacitances if the array capacitors are implemented as a collection of small unit capacitors as described with reference to FIG. 5. Thus, the effect of the capacitances associated with the comparator inputs and the metal routing lines can be ignored.

Figure 6:
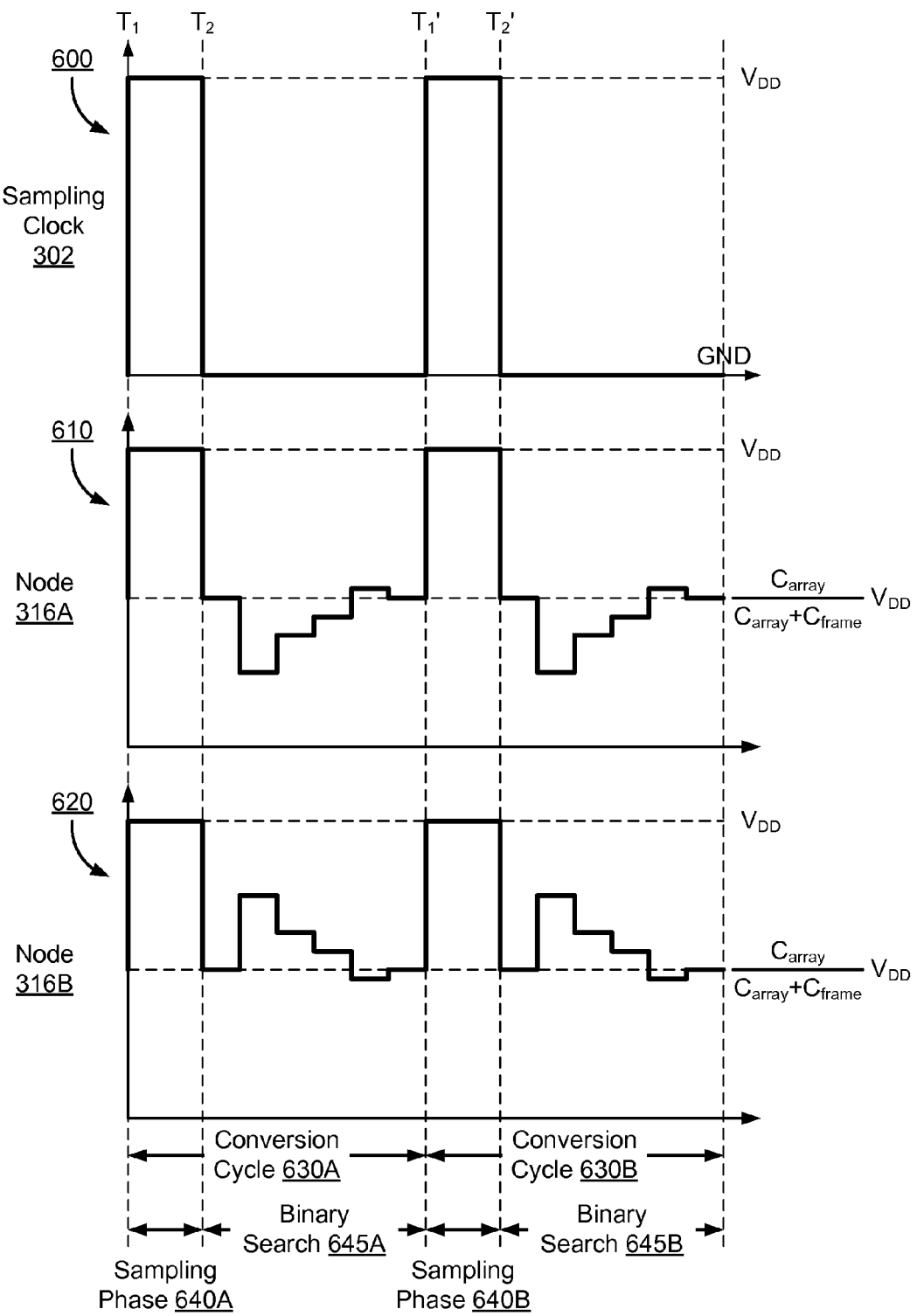
FIG. 6 contains three timing diagrams that describe the operation of a SAR ADC, according to one embodiment.

The layout of the array capacitors relative to the conductive metal frame can be configured so that the value $C_{frame}$ is roughly equal to the value of $C_{array}$, which means the charge redistribution causes the common-mode voltage of nodes 316A and 316B to be reduced to roughly half the supply voltage $V_{DD}$. Assuming the comparator 114 operates at a biasing point near half the supply voltage $V_{DD}$, it is beneficial to configure the frame so that the values of $C_{frame}$ and $C_{array}$ are roughly equal because it effectively establishes the biasing point of the comparator 114 without using a separate power source (e.g., the buffer 204 of the previous switched-capacitor circuit 200). By omitting the separate power source used to establish the biasing point, the current consumption of the SAR ADC 100 is reduced. Since the current consumption of the buffer 204 does not decrease as the sampling rate is decreased, the reduction in current consumption associated with omitting the buffer 204 is especially beneficial at lower sampling rates. After the charge redistribution between the array capacitors and the frame capacitors 318A, 318B establishes the bias voltage, the binary search process begins, as illustrated in FIG. 6.

The comparator 114 of the switched-capacitor circuit 300 operates in the same manner as the comparator 114 of the switched-capacitor circuit 200 of FIG. 2. That is, the output of the comparator 114 (i.e., binary signal 116) turns high when the voltage difference between inverted input and the non-inverted input is positive If the voltage difference between its two inputs is negative, the output of the comparator 114 remains low.

In another embodiment, it may be beneficial to establish a biasing point that is higher than half the supply voltage $V_{DD}$ (e.g., if the comparator 114 contains an input differential pair that is implemented with NMOS transistors, it may be beneficial to set the bias voltage to 60% of $V_{DD}$ rather than 50% of $V_{DD}$). In this case, the conductive metal frame may be configured so that $C_{frame}$ has a smaller value than $C_{array}$, which would cause the charge distribution to reduce the common node voltage to a level higher than half the supply voltage.

In yet another embodiment, it may be beneficial to establish a biasing point that is lower than half the supply voltage $V_{DD}$ (e.g., if the comparator 114 contains an input differential pair that is implemented with PMOS transistors, it may be beneficial to set the bias voltage to 40% of $V_{DD}$). In this embodiment, the frame may be configured so that $C_{frame}$ has a larger value than $C_{array}$. Alternatively, the frame may again be configured so that $C_{frame}$ is smaller than $C_{array}$. In this case, the switched-capacitor circuit 300 would be reconfigured so that the second set of switches 314A, 314B connect to ground rather than the supply voltage $V_{DD}$, and the clock signal (and the frame voltage) would be modified to be at ground during the sampling phase and at the supply voltage $V_{DD}$ during the binary search.

FIG. 4 is a circuit diagram illustrating a detailed view of the first switched-capacitor array 310A in the switched-capacitor circuit 300 of FIG. 3, according to one embodiment. As described above with reference to FIG. 2 and FIG. 3, the switched-capacitor array 310A receives the binary output 120 of the successive approximation register 118 and operates the switches 404, 405 to cause a corresponding voltage change at the common node 316A. Thus, the switched-capacitor array 316A implements the functions of the DAC 122 and the subtractor 110 that are used to perform the binary search process.

Each branch of the switched-capacitor array 310A contains an array capacitor 402, a first switch 404, and a second switch 405. As shown in FIG. 4, the first switch 404 connects the left plate of the array capacitor 402 to the supply voltage $V_{DD}$ of the circuit and the second switch 405 connects the left plate of the array capacitor 402 to ground. In an alternative embodiment, the first switch 404 is connected to a different high voltage $V_+$ and the second switch 405 is connected to a different low voltage $V_-$. In this case, the limits of the SAR ADC's voltage range would be defined by the separated high and low voltages $V_+$ and $V_-$ rather than the supply voltage $V_{DD}$ and ground.

As described with reference to FIG. 2 and FIG. 3, the array capacitors 402 in the switched-capacitor array 310A have binary weights. For example, the second array capacitor $C_2$ 402B has twice the capacitance of the first array capacitor $C_1$ 402A, and the third array capacitor $C_3$ 402C (not shown in FIG. 4) has four times the capacitance of the first array capacitor $C_1$ 402A. In each branch, the control signal for the first switch 404 is the digit of the digital output 120 corresponding to the capacitance of the array capacitor 402 in the branch. For example, the least significant bit $b_1$ of the digital output 120 is the control signal for the switch 404A corresponding to the array capacitor 402A with the smallest capacitance $C_1$, whereas the second-least significant bit $b_2$ is the control signal for the switch 404B corresponding to the array capacitor 402B with the second-smallest capacitance $C_2$. The control signal for the second switch 405 in each branch is the logical complement of the control signal for the first switch. For example, the control signal for the switch 405A is the complement of the least significant bit $b_1$, and the control signal for the switch 405B is the complement of the second-least significant bit $b_2$.

Each branch of the switched-capacitor array 310A also contains an additional switch $S_1$ 406A that is part of the first set of switches as described with reference to FIG. 3. When turned on, the additional switch $S_1$ 406A connects the left plates of the array capacitors 402 to the analog input 102A. When turned off, the additional switch S1 406A disconnects the left plates of the array capacitors 402 from the analog input 102A and disconnects the left plates of the array capacitors 402 from each other.

At the beginning of the binary search process, the binary output 120 is set to an initial value in which the most significant bit $b_n$ is binary 1 and the subsequent bits $b_{n-1}$ through $b_1$ are binary 0. As a result, the switch 404N remains turned on, but the switches 404A through 404M connecting the left plates of the other array capacitors 402A through 402M to $V_{DD}$ are turned off. Meanwhile, the switches 405A through 405M are turned on, thus connecting the left plates of the other array capacitors 402A through 402M to ground. The action of the switches 405A through 405M and 404N injects a charge into the node 316A, which changes the voltage at the node 316A. Since the capacitors 402 have binary weights, the node voltage is reduced by an amount equal to the difference between the sampled input voltage and the voltage represented by the digital output 120.

The second switched-capacitor array 310B of the switched-capacitor circuit 300 is the same as the first switched-capacitor array 310A shown in FIG. 4 except that the control inputs for the switches 404, 405 are swapped. In the second switched-capacitor array 310B, the switches 405 connecting the left plates of the array capacitors to ground are controlled by the corresponding bits in the digital output 120, whereas the switches 404 connecting the left plates to the supply voltage $V_{DD}$ are controlled by the complement of the corresponding bits. As a result, the switches in the second switched-capacitor 310B array cause the voltage at the second common node 316B to change in the opposite direction of the voltage at the first common node 316A. In other words, when the switches in the first switched-capacitor array 310A cause the voltage at the first common node 316A to decrease by some amount, the switches in the second switched-capacitor array 310B cause the voltage at the second common node 316B to decrease by the same amount. The voltage changes caused by the action of the switches in both switched-capacitor arrays 310A, 310B are shown in the binary search periods 645A, 645B in FIG. 6.

Example Frame Capacitor Structure

Figure 5A:
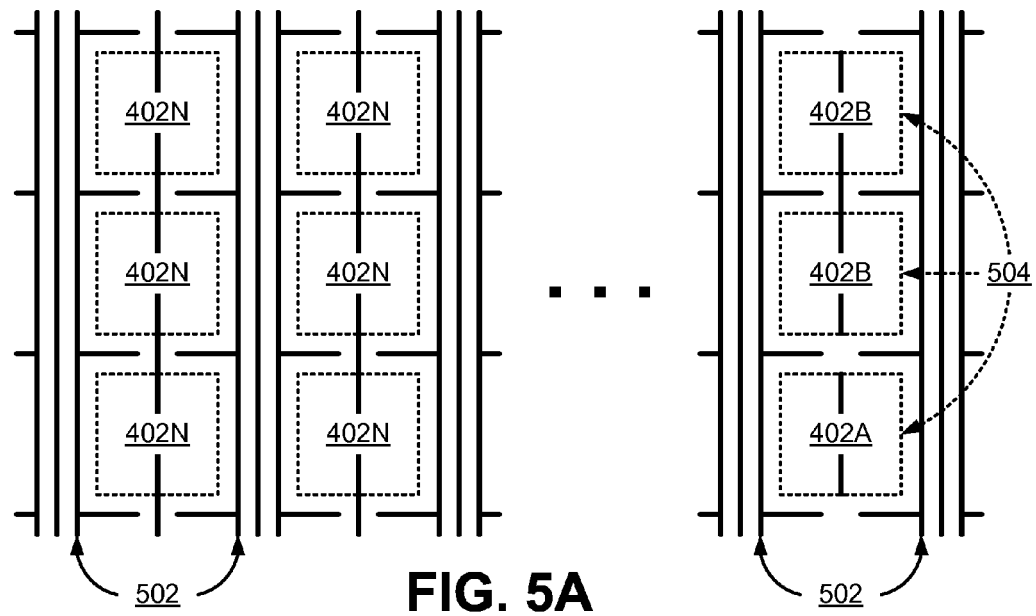
FIG. 5A is a diagram illustrating an example layout of the capacitors in a switched-capacitor array, according to one embodiment.

FIG. 5A is a diagram illustrating an example layout of several array capacitors 402A through 402N in an integrated circuit, according to one embodiment. The array capacitors 402A through 402N shown in FIG. 5A are implemented as a collection of unit capacitors 504. Each unit capacitor 504 is the same size and has the same nominal unit capacitance, and a conductive metal frame 502 separates the unit capacitors 504 to prevent stray capacitances from forming between individual unit capacitors 504. To implement the binary-weighted array capacitors 402A through 402N, individual unit capacitors 504 are connected in parallel, thus combining the unit capacitors 504 into a single capacitor whose capacitance is the sum of the connected unit capacitances. For example, if the first array capacitor 402A is implemented as a single unit capacitor 504, as shown in FIG. 5A, then the second array capacitor 402B may be implemented by connecting two unit capacitors 504 in parallel, thus creating a single capacitor with twice the capacitance of the first array capacitor 402A. Although the final array capacitor 402N is depicted in FIG. 5A as six unit capacitors, the final array capacitor 402N also contains additional unit capacitors that are omitted from FIG. 5A to reduce the size of the drawing. For example, if the SAR ADC 100 has an eight-bit digital output 120, then the final array capacitor 402N would contain 128 unit capacitors connected in parallel.

Figure 5B:
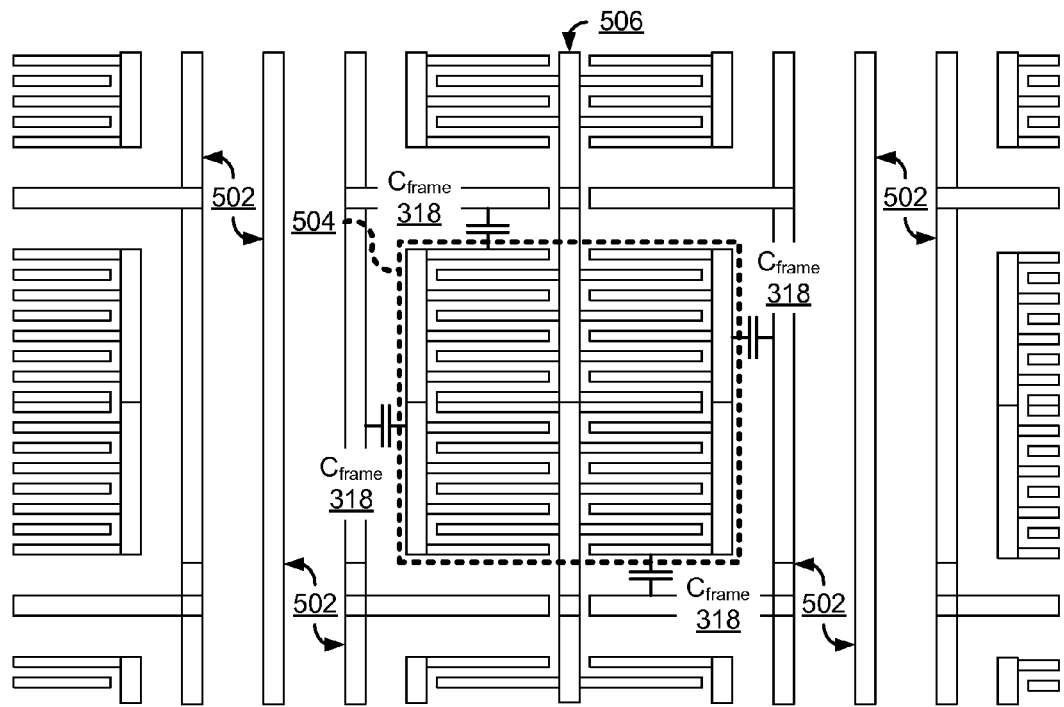
FIG. 5B is a diagram illustrating the frame capacitors on the layout of a unit capacitor, according to one embodiment.

FIG. 5B is a diagram illustrating the frame capacitor 318 surrounding the layout of a single unit capacitor 504, according to one embodiment. The unit capacitor 504 is implemented with interdigitated metal routing layers that form a comb pattern. A first plate of the unit capacitor 504 is formed by an inner comb pattern connected to a central routing line 506, and a second plate is formed by two outer comb patterns. The unit capacitance is formed by the space between the inner and outer comb patterns. The space between the two outer comb patterns and the conductive metal frame 502 forms a capacitance that acts as the unit capacitor's contribution to the frame capacitor 318. The frame capacitor 318 as a whole is the total capacitance between the frame 502 and outer comb pattern of unit capacitors 504.

For the sake of clarity, some layers of the layout are omitted in FIG. 5B. In practice, the outer comb patterns of each unit capacitance are connected using methods known in the art (e.g., vias) to other layers of the integrated circuit that contain routing to the inputs of the comparator 114.

There are several benefits associated with implementing the array capacitors 402A through 402N as a collection of unit capacitors 504. First, larger capacitance values can be implemented with improved accuracy and precision by combining the correct number of unit capacitors in parallel. This is especially advantageous when the array capacitors span a large range of capacitance values. Continuing with the example of an SAR ADC 100 with an eight-bit digital output 120, the largest array capacitor 408N would have 128 times the capacitance of the smallest array capacitor 408A. It is much more accurate to implement such a large capacitor by combining 128 unit capacitors in parallel than to lay out a single large capacitor with the interdigitated metal routing layers shown in FIG. 5B.

A second benefit is that the large amount of space between the unit capacitors 504 and the conductive metal frame 502 creates a frame capacitance that is far greater than the parasitic capacitances associated with the inputs of the comparator 114 or the routing from the switched-capacitor array to the comparator 114. As a result, these other parasitic capacitances absorb an insignificant amount of positive charge compared to the frame capacitors 318A, 318B during the charge redistribution that is described with reference to FIG. 3 and FIG. 7. Thus, the effect of these other parasitic capacitances on the node voltages 316A, 316B can be ignored, which means it is accurate to assume that the biasing point of the comparator 114 is defined solely by the value of the frame capacitors 318A, 318B and the array capacitors 402A through 402N.

FIG. 6 contains three timing diagrams that illustrate the operation of the SAR ADC 100 over two conversion cycles 630A and 630B, according to one embodiment. The first timing diagram 600 represents the value of the sampling clock 302 and, by extension, the voltage of the conductive metal frame 502. The second and third timing diagrams 610, 620 illustrate the voltages at the positive and negative common nodes 316A, 316B, respectively.

As described with reference to FIG. 3, the sampling clock 302 and the voltage of the conductive metal frame 502 are raised to the supply voltage $V_{DD}$ during the sampling phase 640A, 640B. Since the second set of switches 314A, 314B is also turned on during the sampling phase 640A, 640B, the voltages at the two common nodes 316A, 316B are also raised to the supply voltage $V_{DD}$. At time $T_2$, which occurs at the end of the sampling phase, the voltage of the sampling clock 302 and the frame 502 are dropped to ground, and the resulting charge redistribution between the array capacitors and the frame capacitors establishes the biasing point at the nodes 316A, 316B. After the biasing point is established, the binary search process is performed in the binary search phase 645A, 645B, and the action of the switches in the switched-capacitor arrays causes complementary changes in the two common node voltages.

Figure 7:
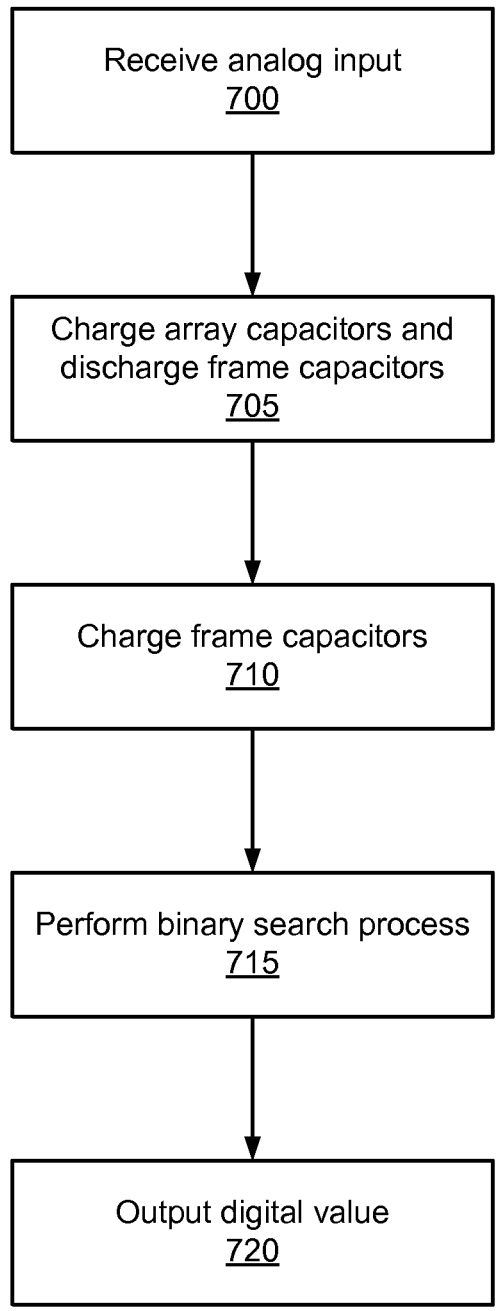
FIG. 7 is a flow chart that illustrates a process for converting an analog voltage to a digital value by using frame capacitances, according to one embodiment.

FIG. 7 is a flow chart that illustrates a process for converting an analog voltage to a digital value by using frame capacitors 318 to establish the biasing point of the comparator 114 in the SAR ADC 100, according to one embodiment. The process begins when the switched-capacitor arrays 310A of the SAR ADC 100 receive 700 an analog input 102A, 102B. Although the analog input 102A, 102B is illustrated as a differential signal, the SAR ADC 100 may also be configured to receive a single-ended signal.

To begin taking the sample, both sets of switches 306A, 306B, 314A, 314B are turned on and the conductive metal frame 502 surrounding the array capacitors 402A through 402N is raised to the supply voltage $V_{DD}$. As a result, the left plates of the array capacitors 402A through 402N are connected to the analog input voltage 102A, 102B, and the right plates are connected to the supply voltage $V_{DD}$. This charges 705 the array capacitors 402A through 402N, which causes the array capacitors 402A through 402N to sample the analog input voltage 102A, 102B relative to the supply voltage $V_{DD}$. Meanwhile, both plates of the frame capacitors 318A, 318B are connected to the supply voltage $V_{DD}$, so any charge that had accumulated in the frame capacitors 318A, 318B during the previous sample cycle is discharged 705.

At the end of the sampling phase, both sets of switches 306A, 306B, 314A, 314B are turned off, and the clock signal 302 drops the voltage of the frame 502 to ground. This allows the nodes 316A, 316B to float, which charges 710 the frame capacitors 318A, 318B by causing a positive charge to flow from the right plates of the array capacitors 402A through 402N into the frame capacitors 318A, 318B. This reduces the voltage at the common nodes 316A, 316B from the supply voltage $V_{DD}$ to a voltage given by the expression $C_{array}/(C_{array}+C_{frame})*V_{DD}$. If the frame capacitors 318A, 318B are laid out to have roughly the same value as the total capacitance of the array capacitors, then the voltage at the common nodes 316A, 316B is reduced to approximately half of the supply voltage $V_{DD}$ after the charge redistribution occurs. This establishes the biasing point for the comparator inputs without a separate power source.

After the charge redistribution between the array capacitors 402A through 402N and the frame capacitors 318A, 318B establishes the biasing point for the comparator inputs, the successive approximation register 118, the comparator 114, and the switched-capacitor arrays 310A, 310B operate together to perform 715 the binary search process that is described with reference to FIG. 1, and FIG. 4. After the binary search process iterates through each digit of the digital output 120, the SAR ADC 100 outputs 720 the digital value representing the analog input voltage 102A, 102B.

Additional Configuration Considerations

The embodiments of the claimed subject matter disclosed herein allow a SAR ADC 100 to use internal frame capacitors 318A, 318B to establish a biasing point for the input terminals of a comparator 114 without using a separate power source. This method of establishing the biasing point for the comparator 114 is advantageous because it allows for a reduction in the overall current consumption of the SAR ADC 100. In particular, the reduction in current consumption is especially significant when the SAR ADC 100 is operated at lower sampling rates. As described with reference to FIG. 2, when a separate power source (e.g., a buffer 204) is used to establish the biasing point, it is difficult to automatically decrease the current consumption of the power source in proportion to the sampling rate. Thus, an SAR ADC 100 that omits the separate power source consumes significantly less current at lower sampling rates.

Although the claimed subject matter was described in the context of a successive approximation analog-to-digital converter, the principles of the appended claims may be applied to any electronic device that contains a switched-capacitor array coupled to the input terminals of an electronic component that would benefit from receiving a biased input. For example, the claimed subject matter may also be applied in a pipeline ADC stage that contains a switched-capacitor array.

Upon reading this disclosure, those of skill in the art will appreciate still additional alternative structural and functional designs for a system and a process for using a frame capacitance to bias the input of an electronic component through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. An analog-to-digital converter (ADC), comprising:
a first plurality of capacitors, each of the first plurality of capacitors having a first plate and a second plate;
a set of first switches, each of the first switches coupling each of the first plates of the first plurality of capacitors to an input terminal for receiving an input voltage responsive to each of the first switches being turned on;
a second switch selectively coupling the second plates of the first plurality of capacitors to a voltage source at a first reference voltage;
a comparator having a first input terminal and a second input terminal, the first input terminal coupled to the second plates of the first plurality of capacitors, and the comparator configured to generate an output based on a voltage difference between the first input terminal and the second input terminal; and
a frame capacitor comprising a conductive frame at least partially surrounding at least part of the first plurality of capacitors to form capacitance between the conductive frame and the second plates of the first plurality of capacitors, the frame capacitor configured to receive charge from the first plurality of capacitors to set a voltage of the first input terminal of the comparator to a predetermined level responsive to turning off the first and second switches.

2. The ADC of claim 1, wherein the first plurality of capacitors have binary-weighted capacitance values.

3. The ADC of claim 1, wherein each of the first plurality of capacitors comprises one or more unit capacitors connected in parallel, the one or more unit capacitors having identical capacitance values.

4. The ADC of claim 1, wherein the conductive frame is coupled to a clock signal, the clock signal alternately pulling the conductive frame to the first reference voltage and pulling the conductive frame to a second reference voltage different from the first reference voltage.

5. The ADC of claim 4, wherein the second switch receives the clock signal as a control signal.

6. The ADC of claim 5, further comprising a delay circuit, an input of the delay circuit coupled to the clock signal and an output of the delay circuit coupled to the conductive frame and a control input of each of the first switches, the delay circuit causing a delay in pulling the conductive frame to the second reference voltage and turning off the first switches responsive to the clock signal turning off the second switch.

7. The ADC of claim 1, further comprising:
a second plurality of capacitors, each of the second plurality of capacitors having a first plate and a second plate and having the same capacitance value as a corresponding capacitor in the first plurality of capacitors;
a set of third switches, each of the third switches coupling each of the first plates of the second plurality of capacitors to a second input terminal for receiving an inverted input voltage responsive to each of the third switches being turned on, the third switches receiving the same control signal as the first switches;
a fourth switch selectively coupling the second plates of the second plurality of capacitors and the second terminal of the comparator to the voltage source at the first reference voltage, the fourth switch receiving the same control signal as the second switch; and
a second frame capacitor comprising a second conductive frame at least partially surrounding at least part of the second plurality of capacitors to form capacitance between the second conductive frame and the second plates of the second plurality of capacitors, the second frame capacitor configured to receive charge from the second plurality of capacitors to set a voltage of the second input terminal of the comparator to the predetermined level responsive to turning off the third and fourth switches;

wherein the output of the comparator represents whether a voltage difference between the first input terminal and the second input terminal exceeds a threshold.

8. An electronic device comprising an analog-to-digital converter (ADC), the ADC comprising:
a first plurality of capacitors, each of the first plurality of capacitors having a first plate and a second plate;
a set of first switches, each of the first switches coupling each of the first plates of the first plurality of capacitors to an input terminal for receiving an input voltage responsive to each of the first switches being turned on;
a second switch selectively coupling the second plates of the first plurality of capacitors to a voltage source at a first reference voltage;
a comparator having a first input terminal and a second input terminal, the first input terminal coupled to the second plates of the first plurality of capacitors, and the comparator configured to generate an output based on a voltage difference between the first input terminal and the second input terminal; and
a frame capacitor comprising a conductive frame at least partially surrounding at least part of the first plurality of capacitors to form capacitance between the conductive frame and the second plates of the first plurality of capacitors, the frame capacitor configured to receive charge from the first plurality of capacitors to set a voltage of the first input terminal of the comparator to a predetermined level responsive to turning off the first and second switches.

9. The electronic device of claim 8, wherein the first plurality of capacitors have binary-weighted capacitance values.

10. The electronic device of claim 8, wherein each of the first plurality of capacitors comprises one or more one unit capacitors connected in parallel, the one or more unit capacitors having identical capacitance values.

11. The electronic device of claim 8, wherein the conductive frame is coupled to a clock signal, the clock signal alternately pulling the conductive frame to the first reference voltage and pulling the conductive frame to a second reference voltage different from the first reference voltage.

12. The electronic device of claim 11, wherein the second switch receives the clock signal as a control signal.

13. The electronic device of claim 12, wherein the ADC further comprises a delay circuit, an input of the delay circuit coupled to the clock signal and an output of the delay circuit coupled to the conductive frame and a control input of each of the first switches, the delay circuit causing a delay in pulling the conductive frame to the second reference voltage and turning off the first switches responsive to the clock signal turning off the second switch.

14. The electronic device of claim 8, wherein the ADC further comprises:
a second plurality of capacitors, each of the second plurality of capacitors having a first plate and a second plate and having the same capacitance value as a corresponding capacitor in the first plurality of capacitors;
a set of third switches, each of the third switches coupling each of the first plates of the second plurality of capacitors to a second input terminal for receiving an inverted input voltage responsive to each of the third switches being turned on, the third switches receiving the same control signal as the first switches;
a fourth switch selectively coupling the second plates of the second plurality of capacitors and a second terminal of the comparator to the voltage source at the first reference voltage, the fourth switch receiving the same control signal as the second switch; and
a second frame capacitor comprising a second conductive frame at least partially surrounding at least part of the second plurality of capacitors to form capacitance between the second conductive frame and the second plates of the second plurality of capacitors, the second frame capacitor configured to receive charge from the second plurality of capacitors to set a voltage of the second input terminal of the comparator to the predetermined level responsive to turning off the third and fourth switches;

wherein the output of the comparator represents whether a voltage difference between the first input terminal and the second input terminal exceeds a threshold.

15. A method for establishing a biasing point for an electronic component, the method comprising:
receiving a signal at a conductive frame that forms a frame capacitor in conjunction with a plurality of capacitors at least partially surrounded by the conductive frame, the signal transitioning between a first reference voltage and a second reference voltage;
turning on a set of first switches to couple first plates of the plurality of capacitors to an input voltage responsive to the signal transitioning from the first reference voltage to the second reference voltage;
turning on a second switch to couple the second plates of the capacitors to a voltage source at the second reference voltage;
setting a voltage of an input terminal of an electronic component to a predetermined level by turning off the second switch to disconnect the second plates of the capacitors from the second reference voltage responsive to the signal transitioning from the second reference voltage to the first reference voltage; and
turning off the set of first switches to disconnect the first plates of the plurality of capacitors from the input voltage responsive to the signal transitioning from the second reference voltage to the first reference voltage.

16. The method of claim 15, wherein the electronic device is a comparator, the comparator configured to generate an output based on the voltage at the input terminal.

17. The method of claim 15, wherein the electronic device is an amplifier, the amplifier configured to generate an output based on the voltage at the input terminal.

18. The method of claim 15, wherein the plurality of capacitors have binary weighted capacitance values.

19. The method of claim 15, wherein the second switch is turned off before the set of first switches is turned off.

20. The method of claim 15, wherein the signal is received from an oscillator.

* * * * *

UNITED STATES PATENT AND TRADEMARK OFFICE
CERTIFICATE OF CORRECTION

PATENT NO. : 8,471,755 B1
APPLICATION NO. : 13/357346
DATED : June 25, 2013
INVENTOR(S) : Pedro Miguel Ferreira de Figueire Page 1 of 1

It is certified that error appears in the above-identified patent and that said Letters Patent is hereby corrected as shown below:

Title Page, Item (73) replace --inc.-- with "Inc.".

In the Claims

In claim 10 on column 13, line 37, replace --one or more one unit-- with "one or more unit".

Signed and Sealed this
First Day of October, 2013

Teresa Stanek Rea
*Deputy Director of the United States Patent and Trademark Office*